US010580865B2

(12) United States Patent
Rachmady et al.

(10) Patent No.: US 10,580,865 B2
(45) Date of Patent: Mar. 3, 2020

(54) TRANSISTOR WITH A SUB-FIN DIELECTRIC REGION UNDER A GATE

(71) Applicant: Intel Corporation, Santa Clara, CA (US)

(72) Inventors: Willy Rachmady, Beaverton, OR (US); Matthew V. Metz, Portland, OR (US); Gilbert Dewey, Hillsboro, OR (US); Chandra S. Mohapatra, Beaverton, OR (US); Nadia M. Rahhal-Orabi, Lake Oswego, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/776,996

(22) PCT Filed: Dec. 24, 2015

(86) PCT No.: PCT/US2015/000412
§ 371 (c)(1),
(2) Date: May 17, 2018

(87) PCT Pub. No.: WO2017/111846
PCT Pub. Date: Jun. 29, 2017

(65) Prior Publication Data
US 2018/0337235 A1 Nov. 22, 2018

(51) Int. Cl.
*H01L 29/10* (2006.01)
*H01L 29/66* (2006.01)
(Continued)

(52) U.S. Cl.
CPC ...... *H01L 29/1083* (2013.01); *H01L 29/0653* (2013.01); *H01L 29/0847* (2013.01);
(Continued)

(58) Field of Classification Search
CPC ............ H01L 29/1083; H01L 29/7851; H01L 29/0847; H01L 29/66545; H01L 29/66795; H01L 29/785; H01L 29/78
See application file for complete search history.

(56) References Cited

U.S. PATENT DOCUMENTS

2014/0197456 A1* 7/2014 Wang .................. H01L 29/785
257/192
2015/0041897 A1 2/2015 Basker et al.
(Continued)

OTHER PUBLICATIONS

International Search Report and Written Opinion dated Sep. 23, 2016 for International Application No. PCT/US2015/000412, 12 pages.

*Primary Examiner* — Julia Slutsker
(74) *Attorney, Agent, or Firm* — Schwabe, Williamson & Wyatt, P.C.

(57) ABSTRACT

Embodiments of the present disclosure describe a semiconductor multi-gate transistor having a semi-conductor fin extending from a substrate and including a sub-fin region and an active region. The sub-fin region may include a dielectric material region under the gate to provide improved isolation. The dielectric material region may be formed during a replacement gate process by replacing a portion of a sub-fin region under the gate with the dielectric material region, followed by fabrication of a replacement gate structure. The sub-fin region may be comprised of group III-V semiconductor materials in various combinations and concentrations. The active region may be comprised of a different group III-V semiconductor material. The dielectric
(Continued)

material region may be comprised of amorphous silicon. Other embodiments may be described and/or claimed.

17 Claims, 11 Drawing Sheets

(51) Int. Cl.
*H01L 29/06* (2006.01)
*H01L 29/08* (2006.01)
*H01L 29/205* (2006.01)
*H01L 29/78* (2006.01)

(52) U.S. Cl.
CPC ...... *H01L 29/205* (2013.01); *H01L 29/66522* (2013.01); *H01L 29/66545* (2013.01); *H01L 29/66795* (2013.01); *H01L 29/7851* (2013.01)

(56) References Cited

U.S. PATENT DOCUMENTS

| | | |
|---|---|---|
| 2015/0064855 A1 | 3/2015 | Cheng et al. |
| 2015/0228780 A1 | 8/2015 | Cheng et al. |
| 2015/0236159 A1* | 8/2015 | He ............... H01L 29/66795 257/401 |
| 2015/0340490 A1 | 11/2015 | An et al. |
| 2016/0172456 A1* | 6/2016 | Li ............... H01L 29/41775 257/288 |

* cited by examiner

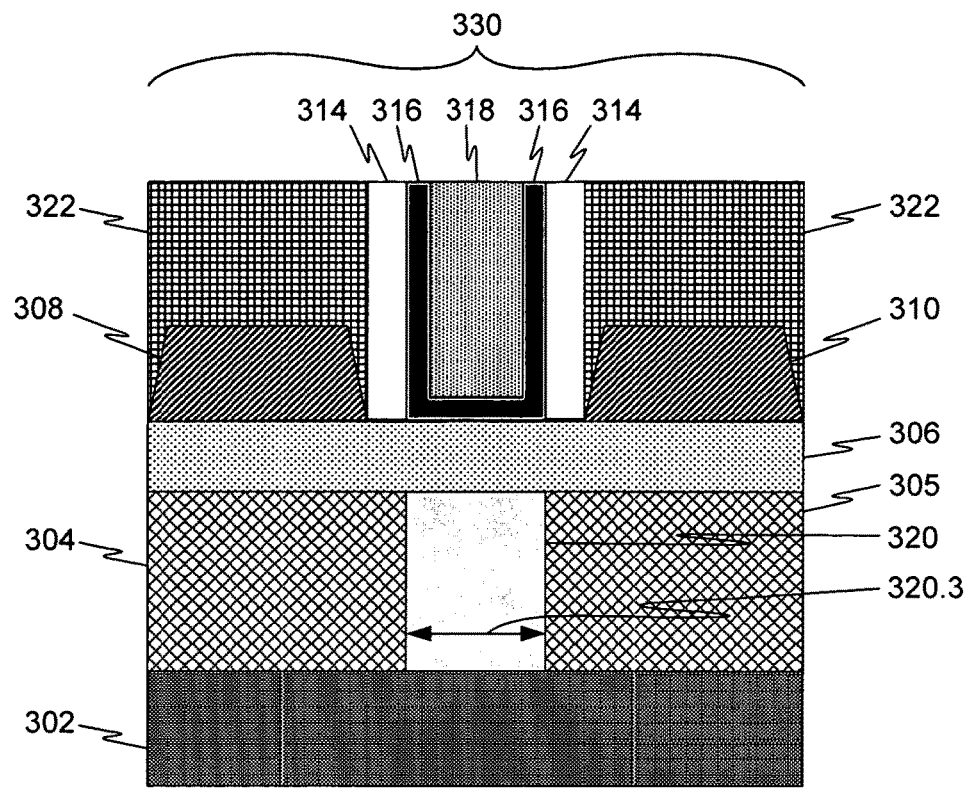
FIG. 3B
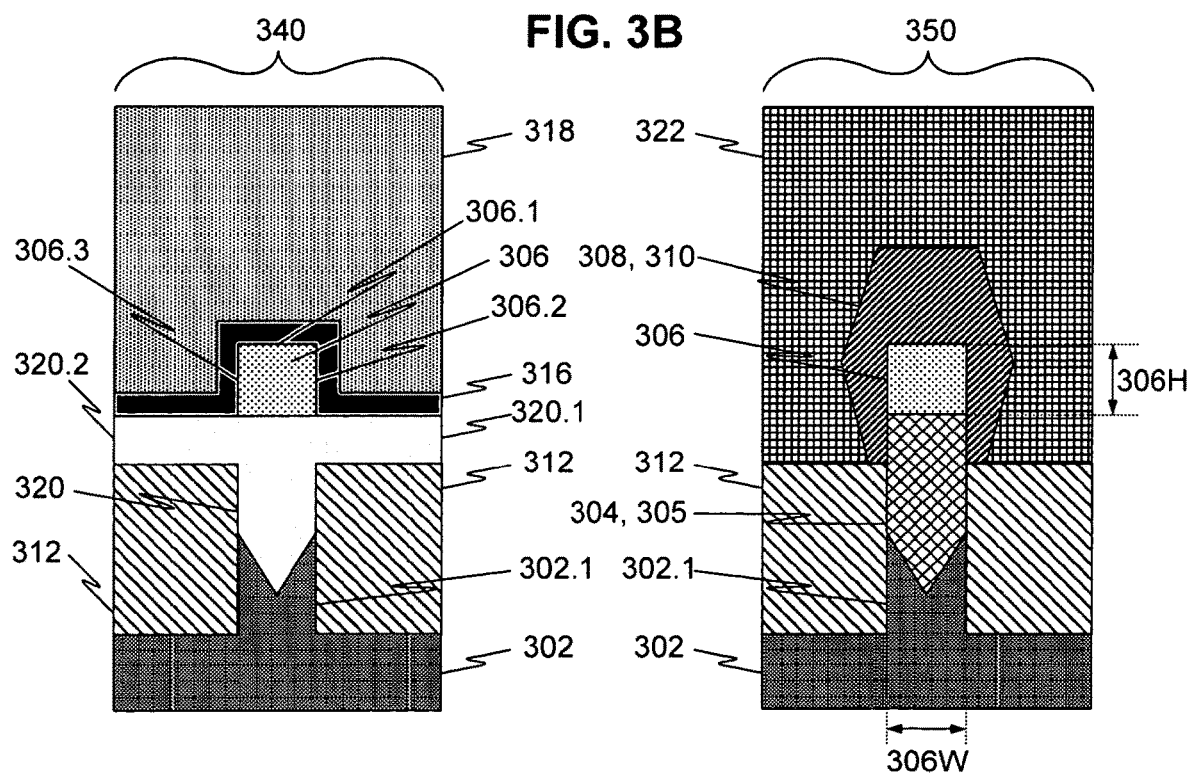
FIG. 3C  FIG. 3D

TRANSISTOR WITH A SUB-FIN DIELECTRIC REGION UNDER A GATE

CROSS REFERENCE TO RELATED APPLICATIONS

The present application is a national phase entry under 35 U.S.C. § 371 of International Application No. PCT/US2015/000412, filed Dec. 24, 2015, entitled "TRANSISTOR WITH A SUB-FIN DIELECTRIC REGION UNDER A GATE", which designated, among the various States, the United States of America. The PCT/US2015/000412 Application is hereby incorporated by reference in its entirety.

FIELD

Embodiments of the present disclosure generally relate to semiconductor integrated circuits (ICs) and more specifically to semiconductor ICs with metal oxide semiconductor field effect transistors (MOSFETs) with a sub-fin region comprised of a dielectric material region under a gate region.

BACKGROUND

To increase the performance and capacity of integrated circuits (ICs), multi-gate MOSFET transistors, such as the tri-gate MOSFET transistor, have been implemented. These transistors have allowed a continued reduction in feature size on ICs while providing certain performance advantages over planar transistors. As the drive to reduce feature size continues, transistor designs may call for new semiconductor materials that may be used alone or in combination with silicon, and may need to include design features to maintain and/or improve IC performance and capacity, as the reduced size pushes the boundaries of physics. One measure of MOSFET transistor performance includes the ability to have minimal current leakage between a source and a drain when a gate is off. Minimizing current leakage may require design considerations, as well as material selection considerations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 3A to 3E schematically illustrate selected features of a multi-gate metal oxide semiconductor field effect transistor, in accordance with some embodiments.

DETAILED DESCRIPTION

Figure 1:
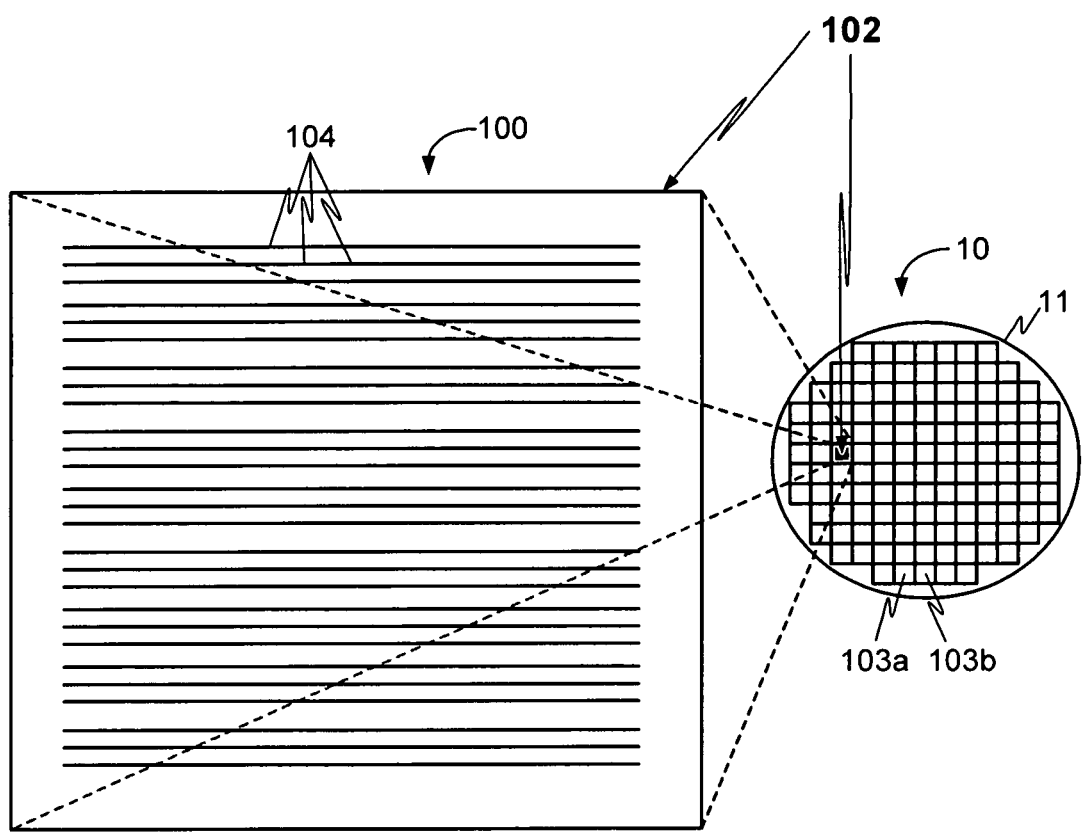
FIG. 1 schematically illustrates a top view of an integrated circuit (IC) assembly, in accordance with some embodiments.

Embodiments of the present disclosure describe multi-gate transistors with a dielectric sub-fin region under the gate region and further describe processes of making the multi-gate transistor. Further embodiments described include devices and systems with the multi-gate transistors disclosed herein.

In the following description, numerous specific details are set forth in order to provide a thorough understanding of the various embodiments. In other instances, well-known semiconductor processes and/or fabrication techniques may not been described in particular detail in order not to unnecessarily obscure the embodiments described herein. Additionally, illustrations of embodiments herein may omit certain structures and/or details in order to not obscure the embodiments described herein.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The terms "coupled to" and "coupled with," along with all derivatives, may be used herein. "Coupled" may mean one or more of the following. "Coupled" may mean that two or more elements are in direct physical and/or electrical contact. However, "coupled" may also mean that two or more elements indirectly contact each other, but yet still cooperate or interact with each other, and may mean that one or more other elements are coupled or connected between the elements that are said to be coupled to each other. The term "directly coupled" may mean that two or more elements are in direct contact. By way of example and not limitation, "coupled" may mean two or more elements or devices are coupled by electrical connections on a printed circuit board such as a motherboard, for example. The electrical connections may provide direct physical coupling by way of the electrical connections. By way of example and not limitation, "coupled" may mean two or more elements/devices cooperate and/or interact through one or more network linkages such as wired and/or wireless networks. By way of example and not limitation, a computing apparatus may include two or more computing devices "coupled" by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more transistor assemblies and/or other device assemblies that include multi-gate transistors having a dielectric sub-fin region under a gate region as disclosed herein. The dielectric sub-fin region may be referred to as a dielectric material region or a dielectric material region of a sub-fin region, where the sub-fin region may be a region on a semiconductor fin formed on a semiconductor substrate. In some embodiments, the dielectric sub-fin region may be amorphous silicon. In some embodiments, the multi-gate transistor may be a tri-gate transistor. For example, the die 102 may include circuitry having transistor structures 104 and/or other device structures that include the multi-gate transistors having a dielectric sub-fin region under a gate region as described herein. The multi-gate transistors with a dielectric sub-fin region under a gate region may provide better isolation between the source and drain resulting in reduced leakage current and better channel control in comparison to multi-gate transistors without a dielectric sub-fin region under a gate region.

Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted. After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from approximately 25.4 mm to approximately 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

Figure 2:
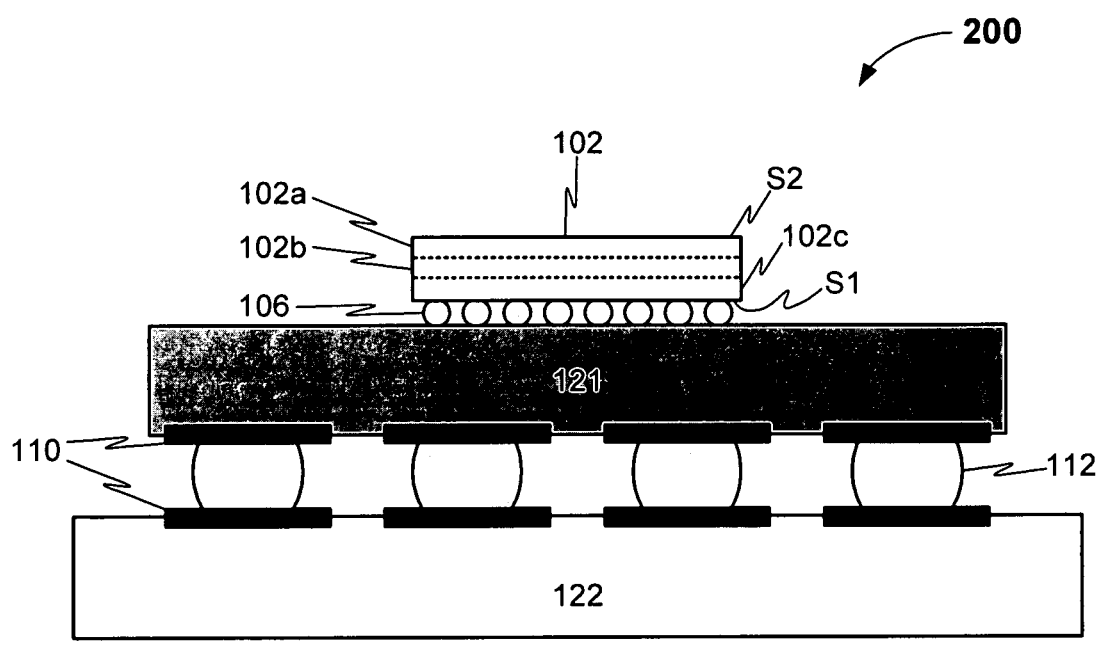
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an integrated circuit (IC) assembly 200 may include one or more of the die 102, package substrate 121 and/or circuit board 122, according to various embodiments. Embodiments described herein for multi-gate transistors having a dielectric sub-fin region under a gate region may be incorporated in the one or more die 102, according to various embodiments. In some embodiments, the dielectric sub-fin region may be amorphous silicon, for example. In some embodiments, the multi-gate transistor may be a tri-gate transistor. The multi-gate transistors having a dielectric sub-fin region under a gate region may be formed as described and disclosed herein. The multi-gate transistors with a dielectric sub-fin region under a gate region may provide better isolation between the source and drain resulting in reduced leakage current and better channel control in comparison to multi-gate transistors without a dielectric sub-fin region under a gate region.

The die 102 may represent a discrete product made from a semiconductor material (e.g., silicon) using semiconductor fabrication techniques such as thin film deposition, lithography, etching and the like used in connection with forming complementary metal oxide semiconductor (CMOS) devices. In some embodiments, the die 102 may be, include, or be a part of a processor, memory, system-on-chip (SoC), or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures (e.g., electrode terminals) that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard.

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3A:
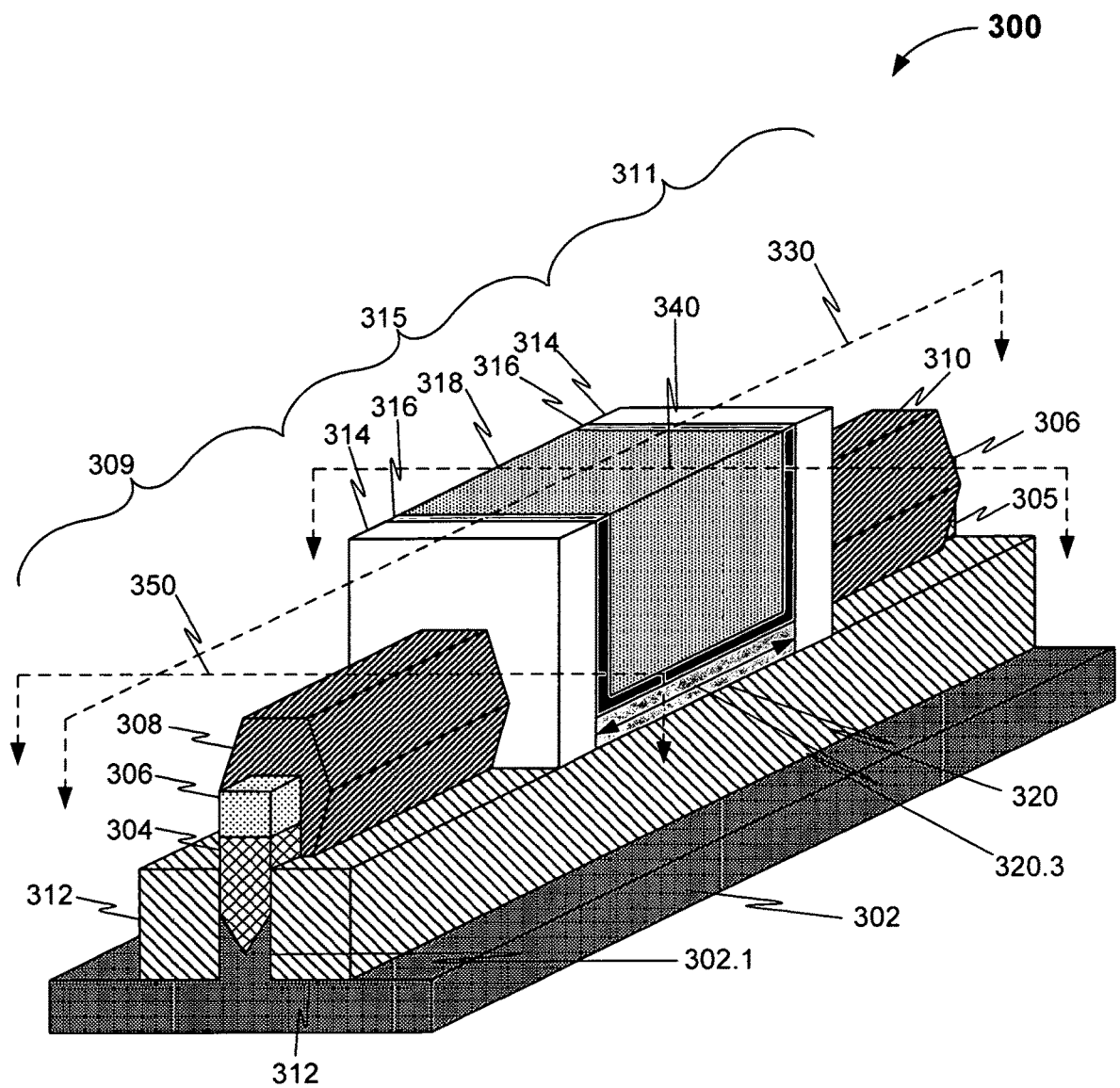
Figure 3E:
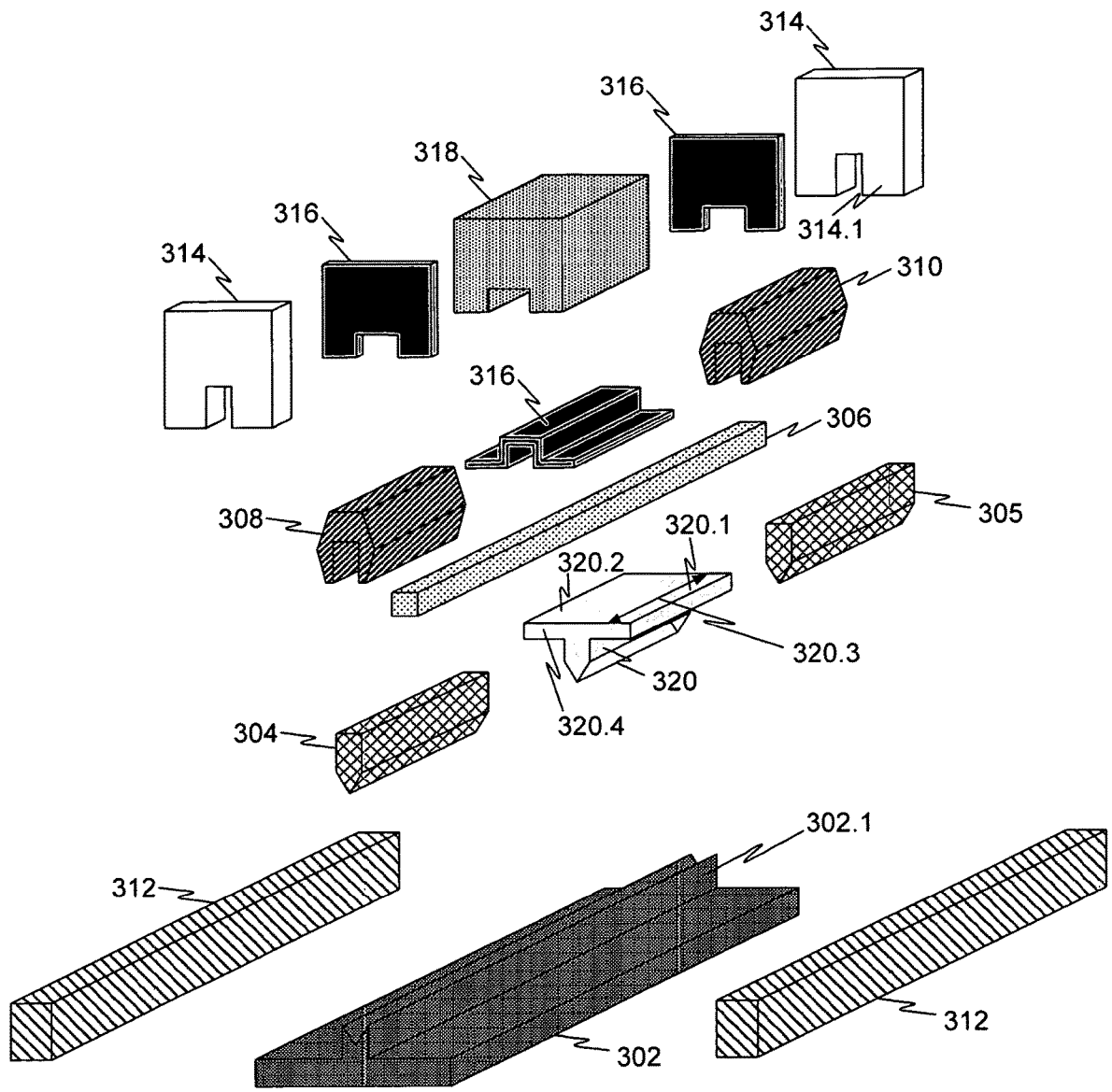

FIGS. 3A to 3E schematically illustrate selected features of a multi-gate metal oxide semiconductor field effect transistor 300 (hereinafter multi-gate transistor 300), in accordance with some embodiments. FIG. 3A schematically illustrates a perspective view of the multi-gate transistor 300. FIG. 3B schematically illustrates a cross-section 330 of the multi-gate transistor 300 along an axis corresponding to the length of the gate. FIG. 3C schematically illustrates a cross-section 340 of a fin of the gate region 315 of the multi-gate transistor 300 along an axis corresponding to the width of the gate. FIG. 3D schematically illustrates a cross-section 350 of a fin of the source region 309 and/or drain region 311 of the multi-gate transistor 300 along an axis parallel to the width of the gate. FIG. 3E schematically illustrates a three dimensional view of selected components of the multi-gate transistor 300. In some embodiments, the multi-gate transistor 300 may be a fully depleted substrate transistor. In some embodiments, the multi-gate transistor 300 may be a fully depleted silicon on insulator (SOI) transistor. In some embodiments, the multi-gate transistor may be a tri-gate transistor.

In reference to FIGS. 3A to 3E, the multi-gate transistor 300 may include a substrate 302 having a substrate fin 302.1 extending from a surface of the substrate 302, as illustrated. The substrate fin 302.1 may span across source, gate, and drain regions 309, 315, 311 of the multi-gate transistor 300. The substrate fin 302.1 may be referred to as a substrate sub-fin. In some embodiments, the substrate 302 may be a semiconductor (e.g., silicon) substrate or an insulating substrate, for example. In some embodiments, the substrate 302 may be a group III-V semiconductor material, for example. The substrate 302 may include a dielectric isolation structure (not shown) to electrically isolate the multi-gate transistor 300. The dielectric isolation structure may be a buried oxide layer in the substrate. The dielectric isolation structure may be an oxide layer in the substrate fin 302.1. In some embodiments, the substrate 302 may be an insulating substrate. For example, the substrate 302 may include a lower monocrystalline silicon substrate upon which is formed an insulating layer, such as a silicon dioxide film. In some embodiments, the multi-gate transistor 300 may be formed on any well-known insulating substrate such as a substrate formed from silicon dioxide, a nitride, an oxide, and/or a sapphire. In some embodiments, the substrate 302 may be a semiconductor substrate, such as but not limited to a monocrystalline silicon substrate or gallium arsenide substrate.

The substrate fin 302.1 may have a first fin 304 coupled to a top surface of the substrate fin 302.1 and may have a second fin 305 coupled to the top surface of the substrate fin 302.1, as illustrated. The first and second fins 304, 305 may be referred to as first and second sub-fins or as a sub-fin or sub-fin structure. The first and second fins 304, 305 may be a group III-V semiconductor material. Group III-V semiconductors may include boron nitride, boron phosphide, boron arsenide, aluminium nitride, aluminium phosphide, aluminium arsenide, aluminium antimonide, gallium nitride, gallium phosphide, gallium arsenide, gallium antimonide, indium nitride, indium phosphide, indium arsenide, and indium antimonide, and combinations of additional group III and/or group V elements to provide a group III-V semiconductor with three or more elements. The first and second fins 304, 305 may be formed from a single fin structure coupled to the substrate fin 302.1 during fabrication of multi-gate transistor 300. The first and second fins 304, 305 and/or the single fin structure may be formed by aspect ratio trapping on substrate 302. In some embodiments, the substrate 302 may be comprised of a group III-V material. For example, the substrate may be comprised of gallium arsenide semiconductor material. In some embodiments, the first and second fins may be replaced by the substrate fin 302.1 extending into the space occupied by the first and second fins 304, 305, as illustrated. In other words, substrate fin 302.1 and the first and second fins 304, 305 may be a part of the same fin structure comprised of a substrate material. If the substrate fin 302.1 and the first and second fins 304, 305 comprise one fin structure, the one fin structure may be referred to by its component fins. In some embodiments, the substrate fin 302.1 is absent, and the first and second fins 304, 305 may be coupled directly to a surface of the substrate 302.

The multi-gate transistor 300 may include a dielectric fin 320 coupled between the first and second fins 304, 305 and coupled to the top of the substrate fin 302.1, as illustrated. In some embodiments, the dielectric fin may be composed of amorphous silicon, for example. The dielectric fin 320 may be referred to as an amorphous silicon fin or sub-fin, as a sub-fin, or as a sub-fin structure. The dielectric fin 320 and the first and second fins 304, 305 may form a continuous fin spanning across the source region 309, gate region 315, and drain region 311 of the multi-gate transistor 300. The term "spanning" means that a first structure overlaps with a length, width, and/or depth of a second structure in a linear direction corresponding to the length, width, and/or depth of the second structure, where an amount of the overlap is approximately equal to the length, width, and/or depth of the second structure. The first structure may extend beyond the overlap.

The continuous fin may be referred to as a sub-fin or sub-fin structure. The continuous fin formed by the first fin 304, second fin 305 and the amorphous fin 320 may be referred to as a sub-fin or a sub-fin structure. The dielectric fin 320 may include spread regions 320.1, 320.2 spreading away in a direction corresponding to an axis parallel to a width of a gate of the gate region 315 from a center fin region of the dielectric fin 320. In other words, the spread regions 320.1, 320.2 may spread in a direction corresponding to cross-section 340 shown in FIG. 3A. The spread regions 320.1, 320.2 may be confined to gate region 315 between spacers 314 of the multi-gate transistor 300. The dielectric fin 320 may span across the length 320.3 of a gate of the gate region 315 of multi-gate transistor 300. The dielectric fin 320 may provide better isolation between the source region 309 and drain region 311 of the multi-gate transistor 300. Better isolation may reduce leakage current of multi-gate transistor 300, resulting in lower power consumption of a device comprised of multi-gate transistors 300.

The multi-gate transistor 300 may include shallow trench isolation (STI) structures 312 coupled to the substrate fin 302.1, the dielectric fin 320, the first fin 304, and the second fin 305, as illustrated. The spread region 320.1, 320.2 of the dielectric fin 320 may be coupled to a top surface of the STI structures 312 as illustrated. The STI structures 312 may be formed on substrate 302 using standard fabrication techniques. For example, STI structures may be fabricated in an early phase of a semiconductor device fabrication process, typically before the formation of multi-gate transistor 300. Generally, a process for forming STI structures includes etching a pattern of trenches in a silicon substrate, depositing one or more dielectric materials to fill the trenches, and removing the excess dielectric material using a technique such as chemical-mechanical planarization. The dielectric material used to form the STI structures 312 may be silicon dioxide, for example, or some other suitable dielectric material such as an oxide of another material or nitride of silicon or another material.

The multi-gate transistor 300 may include a third fin 306 coupled to the first fin 304, the dielectric fin 320, and the second fin 305, as illustrated. The third fin 306 may be referred to as a channel, a fin, a channel fin, or a fin structure. The third fin 306 may span across the source region 309, gate region 315, and drain region 311 of multi-gate transistor 300. The top surface 306.1 (FIG. 3C) of the third fin 306 may be a conducting channel of one of the gates of the multi-gate transistor 300. The sides 306.2, 306.3 (FIG. 3C) of the third fin 306 may be conducting channels of the gates of the multi-gate transistor 300. In other words, the top 306.1 and the two sides 306.2, 306.3 may be three conducting channels of the multi-gate transistor 300. The sum of the width of the two sides 306.2, 306.3 and the top 306.1 defines the gate width of multi-gate transistor 300. The third fin 306 may be comprised of a group III-V semiconductor material. For example, the third fin 306 may be comprised of indium gallium arsenide. In some embodiments, the third fin 306 may be designed to operate in a fully depleted mode of operation when multi-gate transistor 300 is operated. In some embodiments, the third fin 306 may be comprised of undoped indium gallium arsenide.

The combination of the substrate fin 302.1, the first fin 304, second fin 305, the dielectric fin 320, and the third fin 306 may be referred to as a fin of multi-gate transistor 300. The combination of the substrate fin 302.1, the first fin 304, the second fin 305, and the dielectric fin 320 may be referred to as a sub-fin region of a fin of the multi-gate transistor 300. The third fin 306 may be referred to as an active region of the fin of the multi-gate transistor 300. The fin of the multi-gate transistor 300 may be referred to as a semiconductor fin extending from and across a surface of the semiconductor substrate 302. The shape of the fin is illustrated as a rectangular structure for simplicity of describing various embodiments; however, the shape of the fin may be other shapes besides a rectangular shape, such as a tapered shape, for example. The shape of the fin may be determined at least in part by processes used to form various features and regions of the fin. As an example for a tapered shape, the substrate fin 302.1 may be wider on average than the first fin and the second fin 305. Similarly, the first fin and the second fin 305 may be wider than the third fin 306. Additionally, the third fin 306 may be sharply tapered and/or rounded and may have rounded edges as a transition between the sides 306.2, 306.3 and the top 306.1 of the third fin 306. In some embodiments, the top 306.1 of the third fin 306 may not have a flat surface and may be round along the entire top 306.1.

In reference to FIG. 3D, third fin 306 of the multi-gate transistor 300 may have a characteristic width 306W and height 306H. In some embodiments, the height 306H may be between one-half of the width 306W to two times the width 306W. In some embodiments, the height 306H and the width 306W may be approximately the same. In some embodiments, the height 306H and width 306W may be less than 30 nanometers. In some embodiments, the height 306H and width 306W may be less than 20 nanometers. In some embodiments, the height 306H and width 306W may be less than 12 nanometers.

In the gate region 315, the multi-gate transistor 300 may include spacers 314 between the gate region 315 and the source and drain regions 309, 311. The spacers 314 may be coupled to the STI structures 312 on both sides of the fin of multi-gate transistor 300. The spacers 314 may be coupled to the third fin 306, including the top 306.1 and the sides 306.2, 306.3 of the third fin 306. The spacer 314 may have a lower inner portion 314.1 coupled to a side 320.4 of the dielectric fin 320, including the spread regions 320.1, 320.1. The spacer 314 may be coupled to sides of the first fin 304 and the second fin 305. The spacers 314 may provide isolation of the gate of the multi-gate transistor from the source region 309 and drain region 311. The spacers 314 may be used in a replacement gate process to replace a temporary gate with a final transistor gate. In a replacement gate process, a temporary gate, such as a dummy polysilicon gate, for example, may be removed using routine fabrication techniques, leaving the spacers 314 for proper location of a new gate on the multi-gate transistor 300.

The gate region 315 of the multi-gate transistor 300 may include a dielectric layer 316 comprised of a high-kappa dielectric material. The dielectric layer 316 may be coupled to the dielectric fin 320 including spread region 320.1, the spacers 314, and the top 306.1 and sides 306.2, 306.3 of third fin 306, as illustrated. The dielectric layer may isolate a gate electrode 318 of the gate region 315 of multi-gate transistor 300. A high-kappa dielectric material may be composed of hafnium-based high-kappa dielectrics, nitrided hafnium silicates (HfSiON) dielectric, hafnium silicate, zirconium silicate, hafnium dioxide, zirconium dioxide, tantalum pentaoxide ($Ta_2O_5$), and titanium oxide ($TiO_2$). A dielectric material layer comprised of a high-kappa dielectric material may be deposited using atomic layer deposition or chemical vapor deposition, for example, or by any other suitable method for fabrication of semiconductor devices. A high-kappa dielectric may refer to a material having a value of a dielectric constant more than that of silicon nitride, which may have a value of about 7. A low-kappa dielectric may refer to a material having a value of a dielectric constant less than that of silicon dioxide, which may have a value of about 3.9.

The gate region 315 of the multi-gate transistor 300 may include a gate electrode 318 coupled to the dielectric layer 316, as illustrated. The gate electrode 318 may be electrically isolated from the third fin 306, the source region 309, and the drain region 311 by the dielectric layer 316. Gate electrode 318 may be comprised of any suitable metal gate electrode material. In some embodiments, the gate electrode may be a metal gate electrode or an alloy metal gate electrode. For example, a metal gate electrode may be comprised of aluminum, tungsten, tantalum, or titanium, or alloys thereof. In some embodiments, the gate electrode may be formed from one or more materials having a mid-gap work function between 4.6-4.8 eV. In some embodiments, the gate electrode 318 may be a stack of thin films. In some embodiments, the gate electrode 318 and the dielectric layer 316 are formed by a replacement gate process.

Multi-gate transistor 300 may have a source region 309 and a drain region 311. Source region 309 and drain region 311 may be on opposite sides of the gate region 315. The source region 309 may have a source 308 coupled to the third fin 306. The source 308 may be coupled to second fin 304. The source 308 may be a raised source. The source 308 may be comprised of any suitable semiconductor material appropriately doped for an N-type or P-type multi-gate transistor. The drain region 311 may have a drain 310 coupled to the third fin 306. The drain 310 may be coupled to second fin 304. The drain 310 may be a raised drain. The drain 310 may be comprised of any suitable semiconductor material appropriately doped for an N-type or P-type multi-gate transistor. The raised source and drain may be formed by epitaxy.

Spacers 314 may separate source 308 and drain 310 from the gate electrode 318. The source 308 and drain 310 may be coupled to the spacers 314. The source 308 and the drain 310 may be formed of the same conductivity type, such as N-type or P-type conductivity. In some embodiments, source 308 and the drain 310 may have a doping concentration of between about $1\times10^{19}$ and $1\times10^{21}$ atoms/$cm^3$. In some embodiments, the source 308 and the drain 310 may have a uniform concentration of dopant or may include sub-regions of different concentrations or doping profiles such as tip regions (e.g., source/drain extensions). In some embodiments, when transistor 300 is a symmetrical transistor, the source 308 and the drain 310 may have the same doping concentration and profile. In some embodiments, when multi-gate transistor 300 is formed as an asymmetric transistor, the doping concentration and profile of the source 308 and the drain 310 may vary in order to obtain a particular electrical characteristic.

The multi-gate transistor 300 may have an interlayer dielectric 322 that may encapsulate the source region 309 and the drain region 311, as illustrated in FIGS. 3B and 3D. The interlayer dielectric 322 may be coupled to the source and drain 308, 310, the STI structures 312, and the spacers 314. The interlayer dielectric 322 may be coupled to exposed portions of the first fin 304, second fin 305, and third fin 306. The interlayer dielectric 322 may have a top surface flush with or approximately flush with a top surface of the gate electrode 318. The interlayer dielectric 322 may be any suitable dielectric material for electrically isolating source 308 and drain 310 and may be applied using any suitable semiconductor fabrication technique. The interlayer dielectric 322 may be a low-kappa dielectric material. The interlayer dielectric 322 may be silicon dioxide, for example.

The multi-gate transistor 300 may be one of a plurality of multi-gate transistors having fin structures as described in various embodiments, where two or more may be coupled to a substrate and with source regions coupled by a source pad and drain regions coupled by a drain pad and with a gate region spanning across each of the fins and coupled to the substrate. The multi-gate transistor 300 further may include features typically added during a semiconductor fabrication process, including, for example, heavily doped source/drain contact regions, dielectric isolation structures, various oxide and/or nitride materials, deposited silicon, and silicide on the source/drain/gate contact areas.

Figure 4:
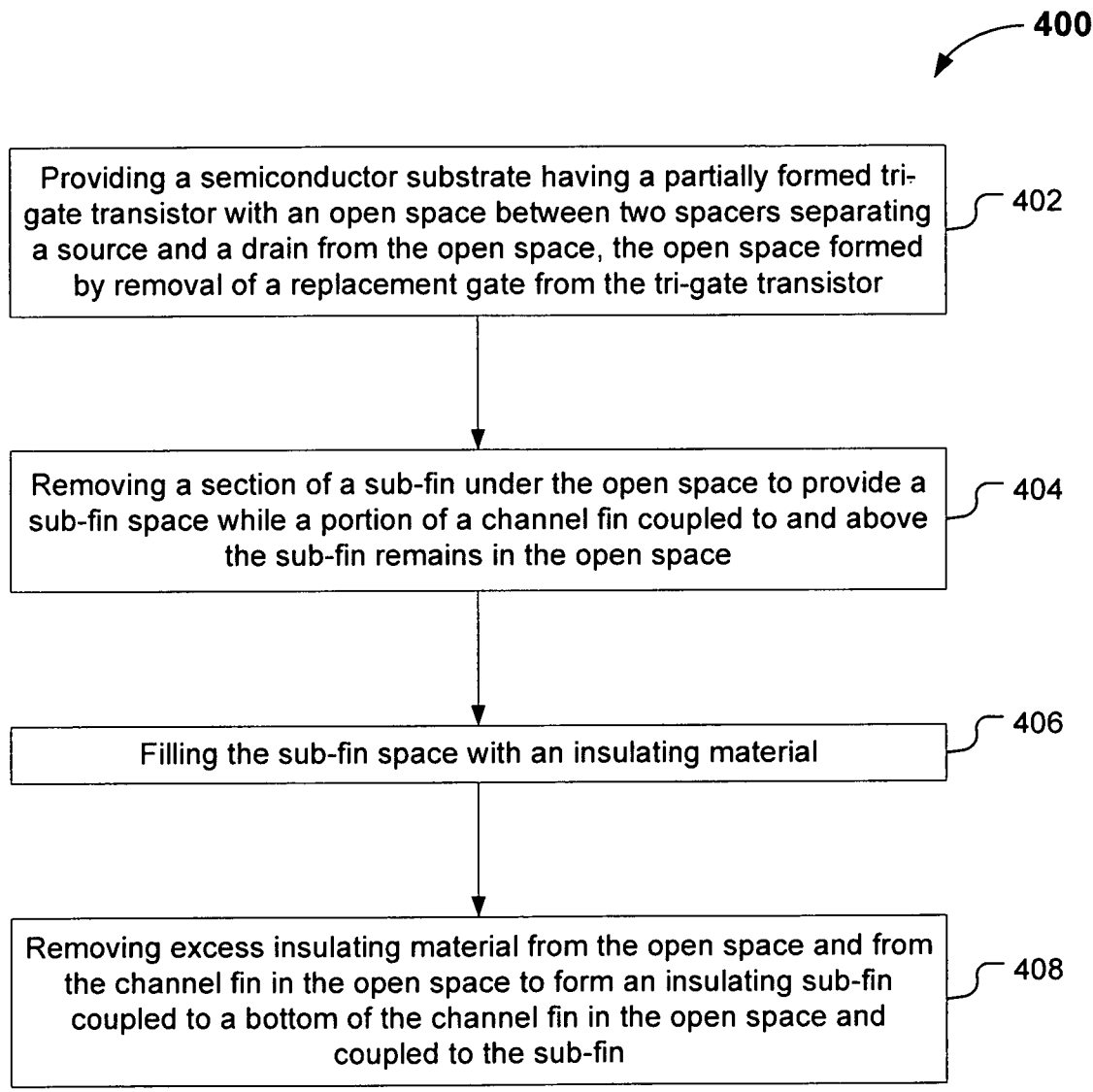
FIG. 4 schematically illustrates a process for fabricating a multi-gate transistor, in accordance with some embodiments.
Figure 5A:
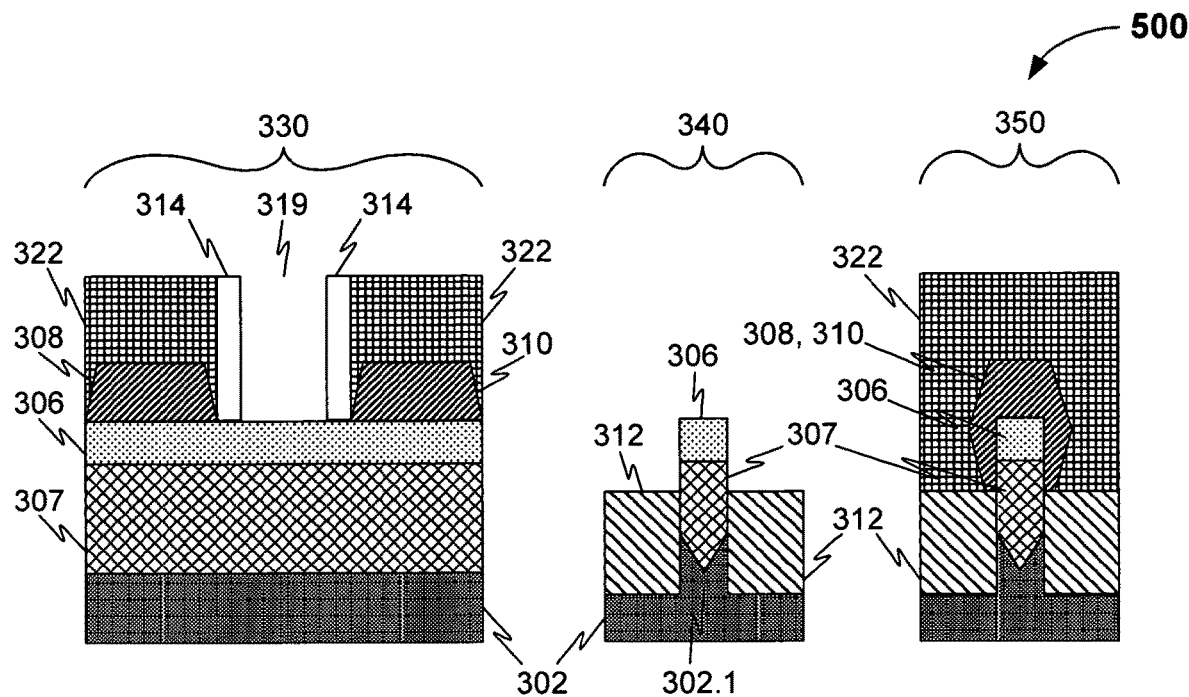
FIGS. 5A to 5F schematically illustrate various embodiments of a multi-gate transistor at various stages of the process of FIG. 4.
Figure 5B:
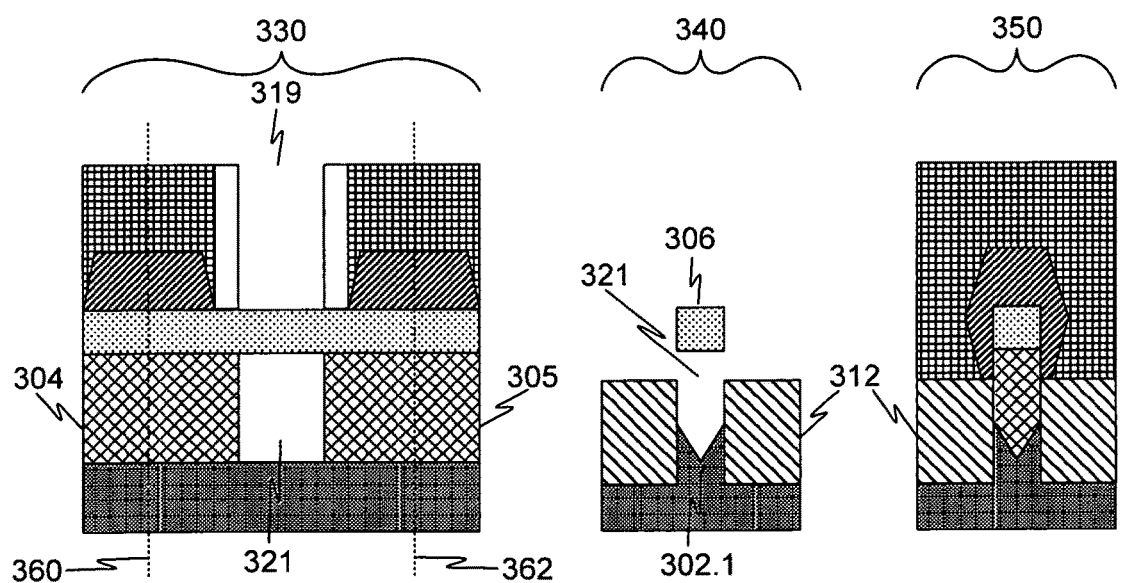

FIG. 4 illustrates a process 400 for fabricating a multi-gate transistor, in accordance with some embodiments. FIGS. 5A to 5F schematically illustrate various embodiments of a multi-gate transistor 500 at various stages of the process 400 of FIG. 4. In some embodiments, the multi-gate transistor 500 may be a tri-gate transistor. To facilitate understanding of the process 400 of FIG. 4, FIGS. 5A to 5F will be described in conjunction with process 400 of FIG. 4. The process 400 illustrated in FIG. 4 and FIGS. 5A to 5F may include pre-processing, which may comprise fabricating a semiconductor fin (302.1, 307, 306) on a semiconductor substrate 302 as illustrated in FIG. 5A. The semiconductor fin (302.1, 307, 306) may include a sub-fin region (302.1, 307) adjacent to the semiconductor substrate 302 and an active region 306 atop the sub-fin region (302.1, 307). The semiconductor fin (302.1, 307, 306) may include a group III-V semiconductor. The pre-processing further may comprise forming a sacrificial gate electrode structure on the semiconductor fin (302.1, 307, 306). The pre-processing further may comprise depositing a pair of spacers 314 on opposing sides of the sacrificial gate electrode structure. The pre-processing further may comprise etching the sacrificial gate electrode structure between the pair of spacers 314 to expose a portion of the sub-fin region 307 of the semiconductor fin (302.1, 307, 306). The etching of the sacrificial gate electrode structure may be to provide open space 319.

At 402, process 400 may include providing a semiconductor substrate having a partially formed multi-gate transistor 500 ("transistor 500") with an open space 319 between two spacers 314 separating a source 308 and a drain 310 from the open space 319, as illustrated in FIG. 5A. The open space 319 may be formed by removal of a replacement gate from the transistor 500 in a replacement gate process for fabricating a semiconductor device as discussed previously for the pre-processing. The replacement gate process may include etching out of a polysilicon gate to provide the open space 319. The transistor 500 may be as illustrated in FIG. 5A, which illustrates cross-sections of the transistor 500, the cross-sections being along a length of the gate 330 (gate cut), along the width of the gate region 340 (fin cut under gate), and along the source/drain 350 (fin cut at source/drain). Cross-sections 330, 340, and 350 correspond to cross-sections of a fabricated multi-gate transistor 500 illustrated in FIGS. 3B, 3C, and 3D, respectively. The transistor 500 may include a substrate 302 with a substrate fin 302.1, as previously described. The transistor 500 may include a sub-fin 307 coupled to and extending from the substrate fin 302.1. A section of the sub-fin 307 under the source 308 may be the same as the sub-fin 304 illustrated in FIGS. 3A to 3E. A section of the sub-fin 307 under the drain 310 may be the same as the sub-fin 305 illustrated in FIGS. 3A to 3E. The sub-fin 307 may be comprised of a group III-V semiconductor, as described for the sub-fins 304 and 305. The transistor 500 may include the third fin 306, as previously described. The third fin 306 may be referred to as a fin, as previously described. The transistor 500 may include interlayer dielectric 322, as previously described. The transistor 500 may include STI structures 312, as previously described.

At 404, process 400 may include removing a section of the sub-fin 307 under the open space 319 to provide a sub-fin space 321 while a portion of the fin 306 coupled to and above the sub-fin 307 remains in the open space 319, as illustrated in FIG. 513. The section of the sub-fin 307 may be removed by a selective etching process under the fin 306. The selective etching process may include a dry etch or a wet etch and various combinations of different dry and wet etch processes. The sub-fin open space 321 may be referred to as a cavity, and the size and shape of the cavity may depend upon the etch process or processes and the type of chemicals used in such process or processes. In some embodiments, the sub-fin open space 321 may extend laterally towards source centerline 360 and/or drain centerline 362. In some embodiments, the sub-fin open space 321 may extend up to the source centerline 360 and/or the drain centerline 362. In some embodiments, the etching process may remove surface portions of the substrate fin 302.1, STI structures 312, and the fin 306.

Figure 5C:
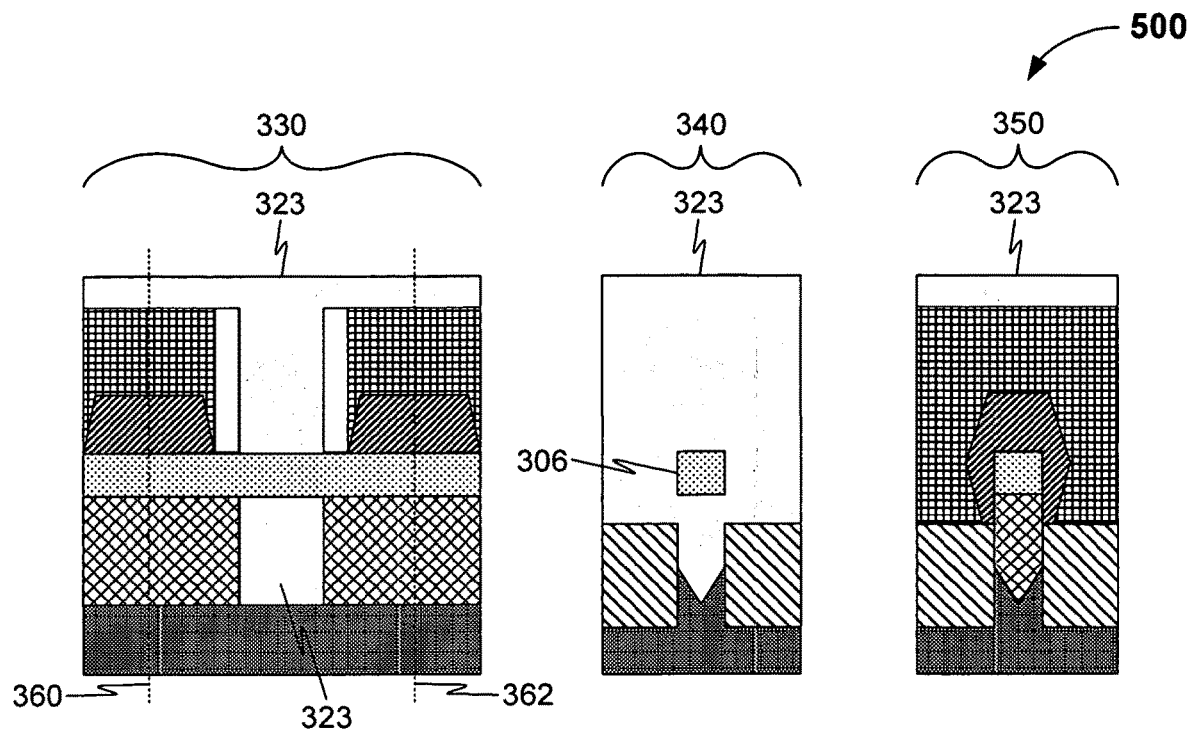

At 406, process 400 may include filling the sub-fin space 321 with a dielectric material 323, as illustrated in FIG. 5C. In some embodiments, the dielectric material may be amorphous silicon, for example. During filling the sub-fin space 321, the dielectric material may fill the open space 319, encapsulate the fin 306, and cover the interlayer dielectric 322, as illustrated. In other words, the dielectric material may form a coating over the surface of the transistor 500, as illustrated. The dielectric material may couple directly to the substrate fin 302.1 of the substrate 302 under the open space 319. The dielectric material 323 may be deposited by chemical vapor deposition or by physical vapor deposition or by another suitable method. In some embodiments, the dielectric material 323 may be doped. In some embodiments, the dopant may be a P-type dopant or an N-type dopant. After filing of the sub-fin space 321, the dielectric material 323 may be planarized to smooth out the dielectric material 323 on the surface of the transistor 500. As an example, planarization may be accomplished by using a chemical mechanical polishing process. In some embodiments, the sub-fin open space 321 may extend laterally towards source centerline 360 and/or drain centerline 362 resulting in dielectric material 323 filling the laterally extended space. In some embodiments, the sub-fin open space 321 may extend up to the source centerline 360 and/or the drain centerline 362 resulting in dielectric material 323 filling the laterally extended space up to the source centerline 360 and/or the drain centerline 362. In some embodiments, the etching process may remove surface portions of the substrate fin 302.1, STI structures 312, and the fin 306 resulting in dielectric material 323 filling the surface portions of the substrate fin 302.1, STI structures 312, and the fin 306 removed during etching.

Figure 5D:
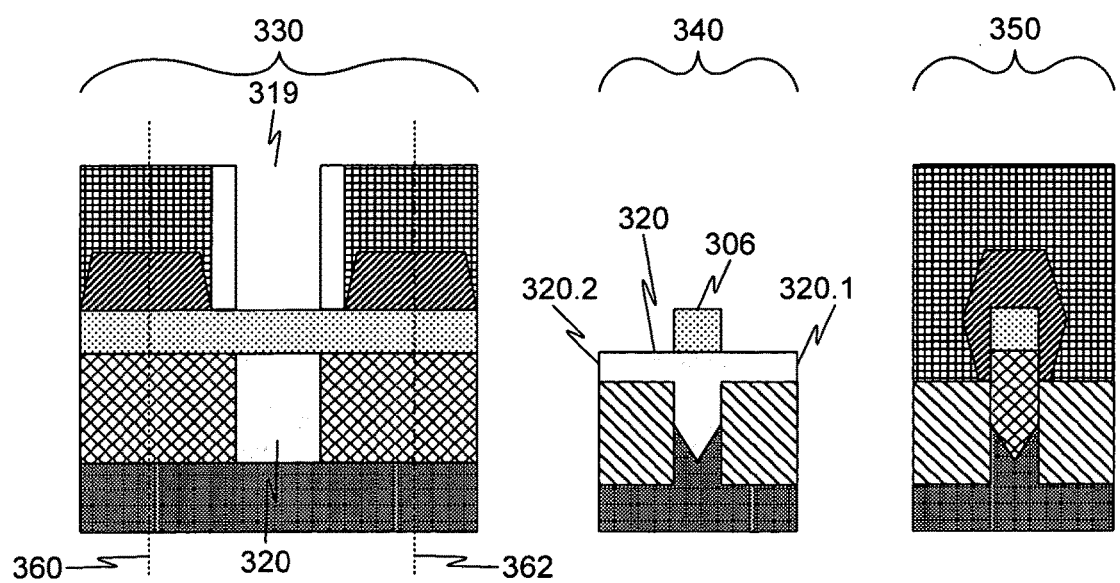

At 408, process 400 may include removing excess insulation material 323 from the open space 319 and from the fin 306 in the open space 319 to form an insulating sub-fin 320 coupled to a bottom of the fin 306 in the open space 319 and coupled to the sub-fin 307, as illustrated in FIG. 5D. Removing the excess insulation material 323 may be by a dry etch process or by another suitable process. The multi-gate transistor 500 with a dielectric sub-fin region under a gate region may provide better isolation between the source and drain resulting in reduced leakage current and better channel control in comparison to multi-gate transistors without a dielectric sub-fin region under a gate region.

Figure 5E:
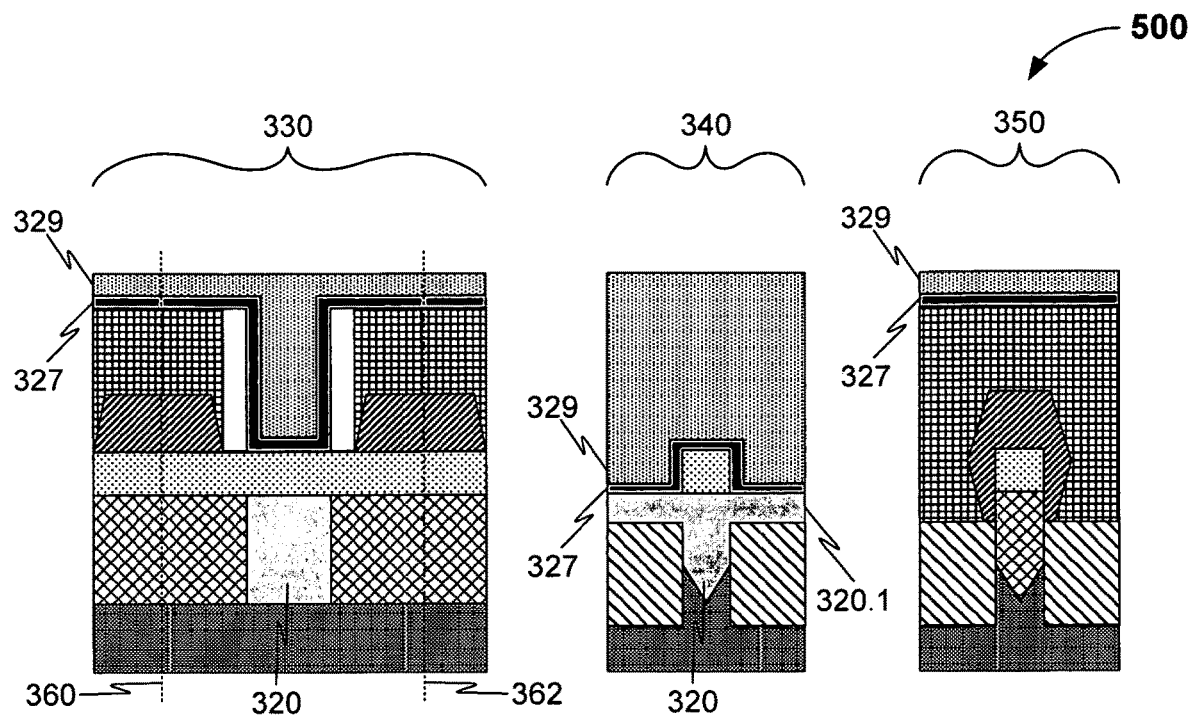
Figure 5F:
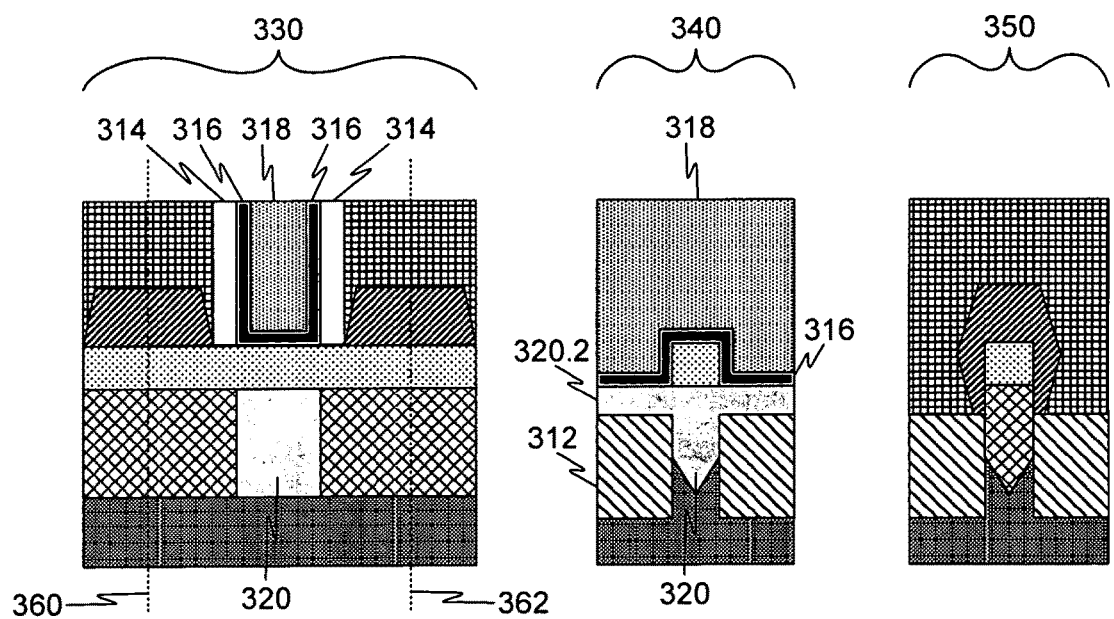

The transistor 500, after removing the dielectric material 323, may receive a replacement gate in a replacement gate process. Accordingly, the process 400 further may include depositing a dielectric material 327 in the open space 319, as illustrated in FIG. 5E. The dielectric material 327 may be a high kappa dielectric material. The dielectric material 327 may be coupled to the spacers 314, the dielectric sub-fin region 320, and the fin 306 in the open space 319. The dielectric material may be coupled to the interlayer dielectric 322, as illustrated. The process 400 further may include depositing a gate electrode material 329 and on the dielectric material 327 to fill the open space 319, as illustrated in FIG. 5E. The dielectric material 327 and the gate electrode material 329 may be deposited by atomic layer deposition, for example, or by some other suitable process. The process 400 further may include removing excess gate electrode material 329 and dielectric material 327 on a surface of the multi-gate transistor 500 to form a gate electrode isolated by the dielectric material 327, as illustrated in FIG. 5F. Removing the excess gate electrode material and dielectric material 327 may be by a chemical mechanical process, for example, or by another suitable process. The transistor 500 of process 400 may be further processed to provide a semiconductor integrated circuit suitable for packaging and coupling to a circuit board of a computing device.

Figure 6:
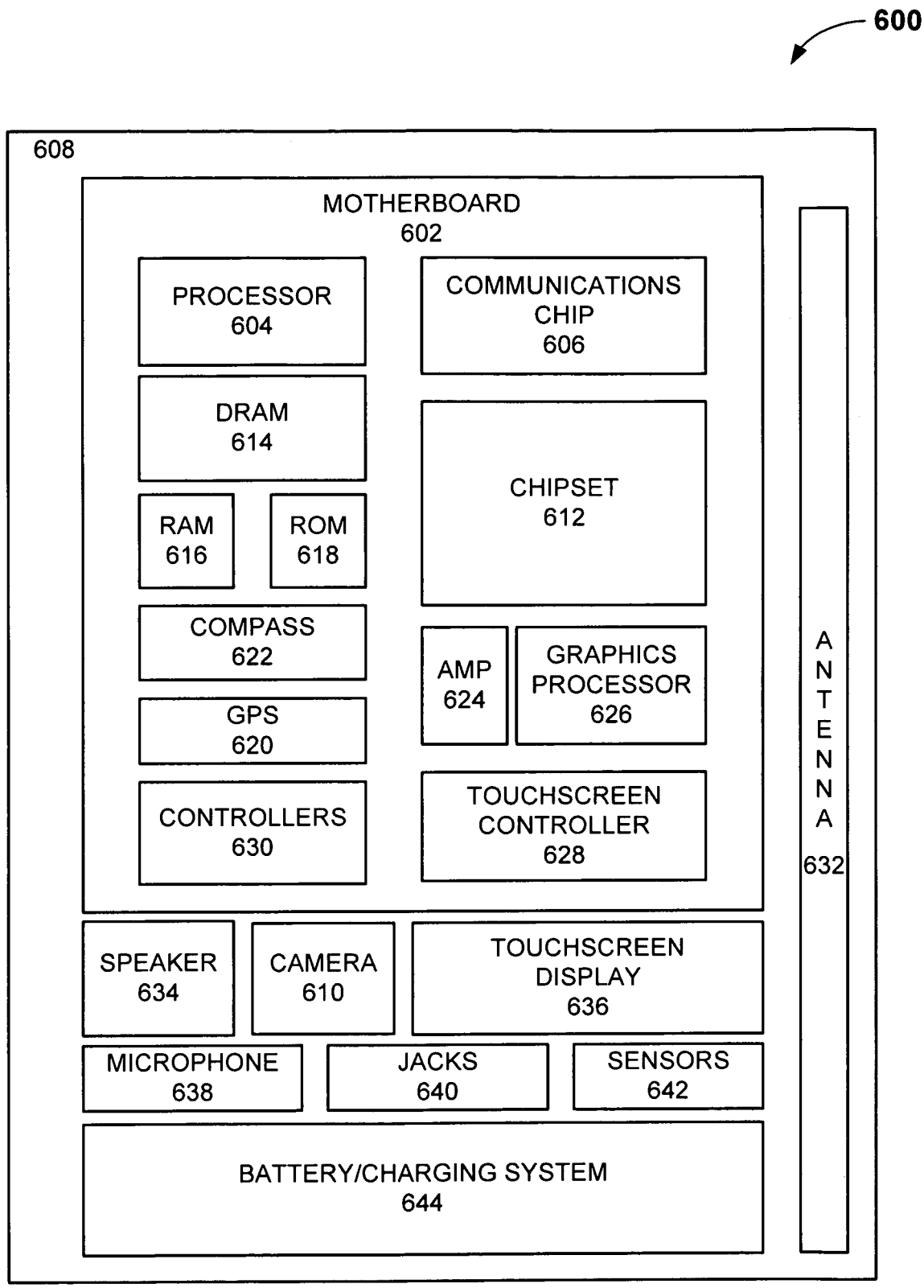
FIG. 6 schematically illustrates a computing device with a multi-gate metal oxide semiconductor field effect transistor having a dielectric sub-fin region under the gate as described herein, in accordance with some embodiments.

Embodiments of the present disclosure may be implemented into a system using any suitable hardware and/or software to configure as desired. FIG. 6 schematically illustrates a computing device 600 with a multi-gate metal oxide semiconductor field effect transistor having a dielectric sub-fin region under the gate as described herein, in accordance with some embodiments. In some embodiments, the dielectric sub-fin region 320 may be amorphous silicon, for example. In some embodiments, the multi-gate transistor may be a tri-gate transistor.

The multi-gate transistor with a dielectric sub-fin region under a gate region may provide better isolation between the source and drain resulting in reduced leakage current and better channel control in comparison to multi-gate transistors without a dielectric sub-fin region under a gate region.

The computing device 600 may house a board such as motherboard 602 (e.g., in housing 608). The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., dynamic random access memory (DRAM) 614), non-volatile memory (e.g., read only memory (ROM) 618), flash memory, random access memory (RAM) 616, a graphics processor 626, a digital signal processor, a crypto processor, a chipset 612, an antenna 632, a display, a touchscreen display 636, a touchscreen controller 628, a battery 644, an audio codec, a video codec, a power amplifier 624, a global positioning system (GPS) device 620, a compass 622, microelectromechanical systems (MEMS) sensor 642, a Geiger counter, an accelerometer, a gyroscope, a speaker 634, a camera 610, and a mass storage device (such as hard disk drive), compact disk (CD), digital versatile disk (DVD), controllers 630, microphone 638, and/or jacks 640, and so forth. Not all of these components are illustrated in the figure.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as WiGig, Wi-Fi and Bluetooth and a second communication chip 606 may be dedicated to longer range wireless communications such as GPS, EDGE, GPRS, CDMA, WiMAX, LTE, EV-DO, and others.

The processor 604, communication chip 606, chipset 612, memory chips 614, 616, 618, and other devices with chips shown in computing device 600 may contain multi-gate transistors as described herein. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 600 may be a mobile computing device in some embodiments. In further implementations, the computing device 600 may be any other electronic device that processes data.

In various implementations, the computing device 600 may be a computer system, a server, a rack server, a blade server, and a super computer system, where components commonly used in mobile devices may be absent. In further implementations, the computing device 600 may be any other electronic device that processes data.

Various components of the computing device 600 shown as being comprised on the motherboard 602 are shown as an illustration of the embodiment and are not intended to be limiting.

Figure 7:
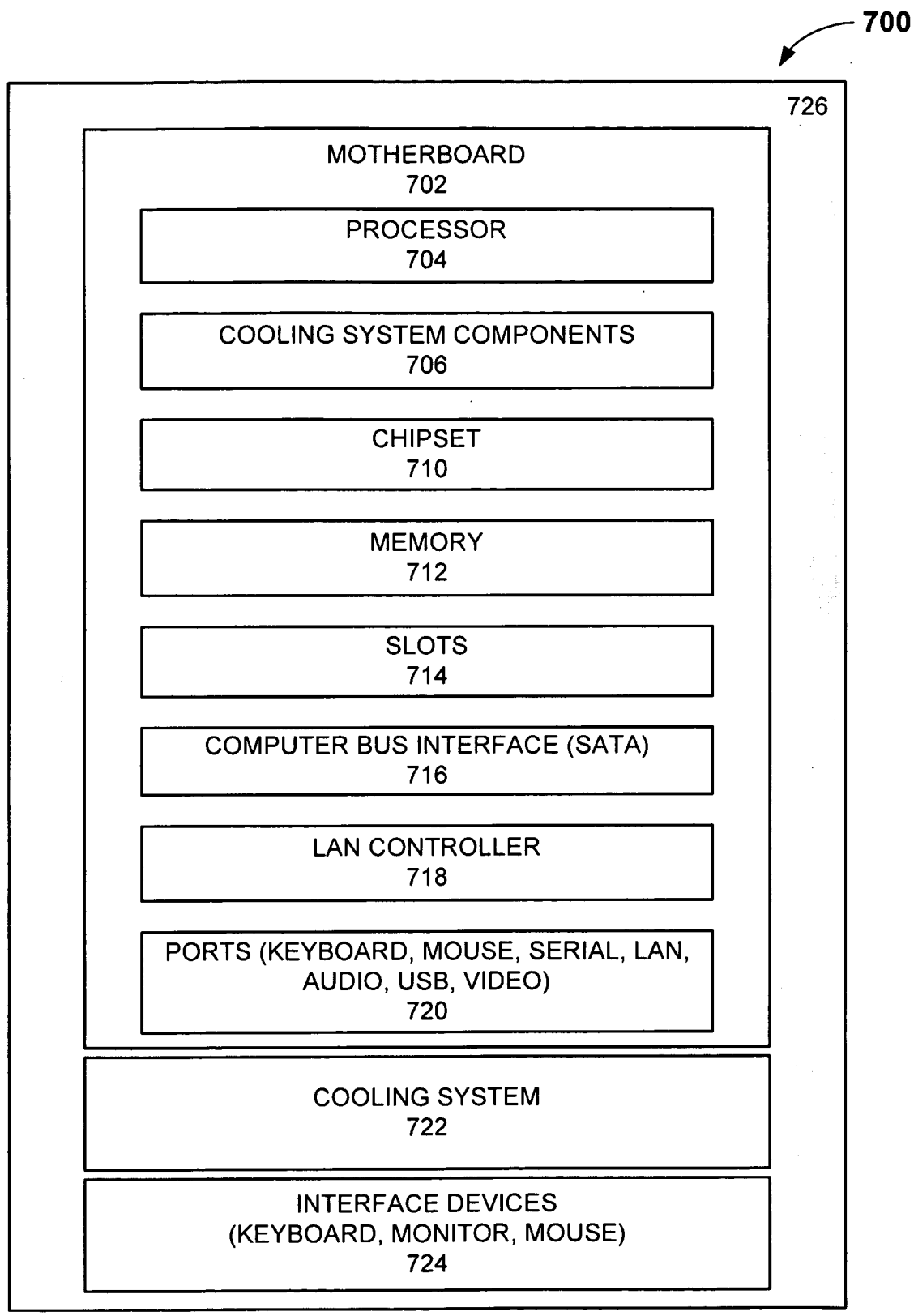
FIG. 7 schematically illustrates a computing device with a multi-gate metal oxide semiconductor field effect transistor having a dielectric sub-fin region under the gate as described herein, in accordance with some embodiments.

FIG. 7 schematically illustrates a computing device 700 with a multi-gate metal oxide semiconductor field effect transistor having a dielectric sub-fin region under the gate as described herein, in accordance with some embodiments. In some embodiments, the dielectric sub-fin region 320 may be amorphous silicon, for example. In some embodiments, the multi-gate transistor may be a tri-gate transistor. The multi-gate transistor with a dielectric sub-fin region under a gate region may provide better isolation between the source and drain resulting in reduced leakage current and better channel control in comparison to multi-gate transistors without a dielectric sub-fin region under a gate region.

The computing device 700 may house a board such as motherboard 702 (e.g., in housing 726). The motherboard 702 may include a number of components, including but not limited to a processor 704, liquid cooling system components 706, chipset 710, memory 712, slots 714, computer bus interface 716, local area network (LAN) controller 718, cooling system 722, interface devices 724, and ports 720. The chipset 710 may include a communications chip. The components may be physically and electrically coupled to the motherboard 702 and may include other components. The term "processor" may refer to any device or portion of a device that processes electronic data from registers and/or memory to transform that electronic data into other electronic data that may be stored in registers and/or memory.

In some embodiments, the cooling system components 706 may include routing for the cooling fluid and pumping devices for pumping the cooling fluid. In some embodiments, the heat exchangers 708 may be coupled to various heat generating components of the computing device 700. The cooling system components 706 may be coupled to the one or more heat exchangers 708 to route the cooling fluid through the heat exchangers 708.

Depending on applications, the computing device 700 may include other components that may or may not be physically and electrically coupled to the motherboard 702. These other components may include, but are not limited to, a liquid cooling system, interface devices (keyboard, display, mouse), memory, a graphics processor, a digital signal processor, a crypto processor, a chipset, a touchscreen display, a touchscreen controller, a battery, an audio codec, a video codec, a power amplifier, a speaker, a camera, and a mass storage device (such as hard disk drive, compact disk (CD), digital versatile disk (DVD), and so forth). In various implementations, the computing device 700 may be a computer system, a server, a rack server, a blade server, and a super computer system. In further implementations, the computing device 700 may be any other electronic device that processes data.

Various components of the computing device 700 shown as being comprised on the motherboard 702 are shown as an illustration of the embodiment and are not intended to be limiting.

EXAMPLES

According to various embodiments, the present disclosure describes semiconductor ICs with multi-gate metal oxide semiconductor field effect transistors (MOSFETs) with a dielectric sub-fin region in the gate region as illustrated and described for the various embodiments.

Example 1 of a semiconductor device may comprise a semiconductor substrate; a semiconductor fin extending from the semiconductor substrate and comprising a sub-fin region adjacent to the semiconductor substrate and an active region atop the sub-fin region; a source region and a drain region formed in the active region of the fin; a gate electrode structure formed over the active region of the fin and disposed between the source region and the drain region; and a dielectric material region formed in the sub-fin region below at least a portion of the gate electrode structure, wherein the dielectric material region does not extend past a centerline of the source region or a centerline of the drain region.

Example 2 may include the subject matter of Example 1 and other examples herein, wherein the sub-fin region comprises a first group III-V semiconductor material, the active region comprises a second group III-V semiconductor material, and the dielectric material region comprises amorphous silicon.

Example 3 may include the subject matter of Example 1 and other examples herein, wherein the semiconductor substrate includes a dielectric isolation structure.

Example 4 may include the subject matter of Example 1 and other examples herein, wherein the sub-fin region further comprises a substrate region adjacent the semiconductor substrate, wherein the substrate region and the semiconductor substrate are comprised of a semiconductor material.

Example 5 may include the subject matter of Example 1 and other examples herein, wherein the semiconductor device further may comprise shallow trench isolation structures coupled to opposite sides of the sub-fin region.

Example 6 may include the subject matter of Example 5 and other examples herein, wherein a top surface of the shallow trench isolation structures is below an interface between the sub-fin region and the active region of the semiconductor fin.

Example 7 may include the subject matter of Example 6 and other examples herein, wherein the dielectric material region further may comprise spread regions coupled to the top surface of the shallow trench isolation structures, wherein the spread regions are in a direction of a width of the gate.

Example 8 may include the subject matter of Example 7 and other examples herein, wherein the semiconductor device further may comprise a high kappa dielectric layer coupled to a top surface and the two opposite side surfaces of the active region, coupled to the spread regions of the dielectric material region, and coupled to spacers separating the gate electrode structure and from the source region and the drain region; and a gate electrode coupled to the high kappa dielectric layer.

Example 9 may include the subject matter of Example 8 and other examples herein, wherein the high kappa dielectric layer and the gate electrode are a replacement structure formed in a replacement gate process.

Example 10 may include the subject matter of Example 8 and other examples herein, wherein the source region comprises a raised source and the drain region comprises a raised drain.

Example 11 may include the subject matter of Example 10 and other examples herein, wherein the semiconductor device further may comprise an interlayer dielectric material coupled to the raised source, the raised drain, the shallow trench isolation structures, and the spacers.

Example 12 may include the subject matter of any one of Examples 1-11 and other examples herein, wherein the semiconductor substrate is comprised of silicon, the sub-fin region is comprised of gallium arsenide, and the active region is comprised of indium gallium arsenide.

Example 13 of a process for fabricating a semiconductor device may comprise fabricating a semiconductor fin on a semiconductor substrate, wherein the semiconductor fin includes a sub-fin region adjacent to the semiconductor substrate and an active region atop the sub-fin region, wherein the semiconductor fin includes a group III-V semiconductor; forming a sacrificial gate electrode structure on the semiconductor fin; depositing a pair of spacers on opposing sides of the sacrificial gate electrode structure; etching the sacrificial gate electrode structure between the pair of spacers to expose a portion of the sub-fin region of the semiconductor fin; etching the exposed portion of the sub-fin region to form a cavity in the sub-fin region under the active region of the semiconductor fin; and depositing an insulating material into the cavity.

Example 14 may include the subject matter of Example 13 and other examples herein, wherein the insulating material is an amorphous silicon.

Example 15 may include the subject matter of Example 13 and other examples herein, wherein the process further may comprise planarizing the insulating material to remove excess insulating material; and etching the insulating material to re-expose the active region of the semiconductor fin.

Example 16 may include the subject matter of Example 15 and other examples herein, wherein the process further may comprise depositing a high kappa dielectric material layer on the spacers, the insulating material, and the active region; depositing a gate electrode material on the high kappa dielectric material layer; and removing excess gate electrode material and excess high kappa dielectric material layer.

Example 17 may include the subject matter of Example 13 and other examples herein, wherein the sub-fin region includes a first group III-V semiconductor material and the active region includes a second group III-V semiconductor material.

Example 18 may include the subject matter of Example 13 and other examples herein, wherein the cavity spans a length between the pair of spacers.

Example 19 of a computing device may comprise a circuit board; and a semiconductor device coupled to the circuit board and including a plurality of multi-gate transistors disposed on the semiconductor device, one or more of the multi-gate transistors including a semiconductor substrate with a semiconductor fin extending from the semiconductor substrate and including a sub-fin region adjacent to the semiconductor substrate and an active region atop the sub-fin region, a source region and a drain region formed in the active region of the fin, a gate electrode structure formed over the active region of the fin and disposed between the source region and the drain region, and a dielectric material region formed in the sub-fin region below at least a portion of the gate electrode structure, wherein the dielectric material region does not extend past a centerline of the source region or a centerline of the drain region.

Example 20 may include the subject matter of Example 19 and other examples herein, wherein the sub-fin region includes a group III-V semiconductor material, the active region includes a second group III-V semiconductor material, and the dielectric material region is an amorphous silicon.

Example 21 may include the subject matter of Example 19 and other examples herein, wherein the sub-fin region further comprises a substrate region adjacent to the semiconductor substrate and the computing device further comprises shallow trench isolation structures coupled to opposite sides of the sub-fin region, wherein a top surface of the shallow trench isolation structures is below an interface between the sub-fin region and the active region, wherein the dielectric material region further includes spread regions coupled to the top surface of the shallow trench isolation structures, and the spread regions are in a direction of a width of the gate electrode structure; a high kappa dielectric layer coupled to a top surface and side surfaces of the active region, coupled to the spread regions of the dielectric material region, and coupled to spacers separating the gate electrode structure from the source region and the drain region; and a gate electrode of the gate electrode structure, the gate electrode is coupled to the high kappa dielectric layer, wherein the high kappa dielectric layer and the gate electrode are a replacement structure formed in a replacement gate process.

Example 22 may include the subject matter of Example 21 and other examples herein, wherein the source region comprises a raised source coupled to the active region and the drain region comprises a raised drain coupled to the active region, and an interlayer dielectric material is coupled to the raised source, the raised drain, the shallow trench isolation structures, and the spacers.

Example 23 may include the subject matter of any one of Examples 19-22 and other examples herein, wherein the semiconductor substrate is comprised of silicon, the sub-fin region includes a gallium arsenide semiconductor, and the active region includes a indium gallium arsenide semiconductor.

Example 24 may include the subject matter of Example 19 and other examples herein, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 25 may include the subject matter of Example 19 and other examples herein, wherein the computing device is a desktop computer, a server, or a super computer and includes one or more of a display, a processor, a cooling system, a chipset, a memory, a slot, a computer bus interface, a local area network controller, a port, or interface devices coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments. The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
    a semiconductor substrate;
    a semiconductor fin extending from the semiconductor substrate and comprising a sub-fin region adjacent to the semiconductor substrate and an active region atop the sub-fin region;
    a source region and a drain region formed in the active region of the fin;
    a gate electrode structure formed over the active region of the fin and disposed between the source region and the drain region;
    shallow trench isolation structures coupled to opposite sides of the sub-fin region; and
    a dielectric material region formed in the sub-fin region below at least a portion of the gate electrode structure, wherein the dielectric material region does not extend past a centerline of the source region or a centerline of the drain region, and wherein the dielectric material region includes spread regions coupled to a top surface of the shallow trench isolation structures, wherein the spread regions are in a direction of a width of the gate electrode structure.

2. The semiconductor device of claim 1, wherein the sub-fin region comprises a first group III-V semiconductor material, the active region comprises a second group III-V semiconductor material, and the dielectric material region comprises amorphous silicon.

3. The semiconductor device of claim 1, wherein the semiconductor substrate includes a dielectric isolation structure.

4. The semiconductor device of claim 1, wherein the sub-fin region further comprises a substrate region adjacent the semiconductor substrate, wherein the substrate region and the semiconductor substrate are comprised of a semiconductor material.

5. The semiconductor device of claim 1, wherein the top surface of the shallow trench isolation structures is below an interface between the sub-fin region and the active region of the semiconductor fin.

6. The semiconductor device of claim 1, further comprising:
a high kappa dielectric layer coupled to a top surface and the two opposite side surfaces of the active region, coupled to the spread regions of the dielectric material region, and coupled to spacers separating the gate electrode structure from the source region and the drain region; and
a gate electrode coupled to the high kappa dielectric layer.

7. The semiconductor device of claim 6, wherein the high kappa dielectric layer and the gate electrode are a replacement structure formed in a replacement gate process.

8. The semiconductor device of claim 6, wherein the source region comprises a raised source and the drain region comprises a raised drain.

9. The semiconductor device of claim 8, further comprising:
an interlayer dielectric material coupled to the raised source, the raised drain, the shallow trench isolation structures, and the spacers.

10. The semiconductor device of claim 1, wherein the semiconductor substrate is comprised of silicon, the sub-fin region is comprised of gallium arsenide, and the active region is comprised of indium gallium arsenide.

11. A computing device, comprising:
a circuit board; and
a semiconductor device coupled to the circuit board and including a plurality of multi-gate transistors disposed on the semiconductor device, one or more of the multi-gate transistors including:
a semiconductor substrate with a semiconductor fin extending from the semiconductor substrate and including a sub-fin region adjacent to the semiconductor substrate and an active region atop the sub-fin region,
a source region and a drain region formed in the active region of the fin,
a gate electrode structure formed over the active region of the fin and disposed between the source region and the drain region,
a dielectric material region formed in the sub-fin region below at least a portion of the gate electrode structure, wherein the dielectric material region does not extend past a centerline of the source region or a centerline of the drain region, and
shallow trench isolation structures coupled to opposite sides of the sub-fin region, wherein a top surface of the shallow trench isolation structures is below an interface between the sub-fin region and the active region, wherein the dielectric material region further includes spread regions coupled to the top surface of the shallow trench isolation structures, and the spread regions are in a direction of a width of the gate electrode structure.

12. The computing device of claim 11, wherein the sub-fin region includes a first group III-V semiconductor material, the active region includes a second group III-V semiconductor material, and the dielectric material region is an amorphous silicon.

13. The computing device of claim 11, wherein the sub-fin region further comprises a substrate region adjacent to the semiconductor substrate and the computing device further comprises:
a high kappa dielectric layer coupled to a top surface and side surfaces of the active region, coupled to the spread regions of the dielectric material region, and coupled to spacers separating the gate electrode structure from the source region and the drain region; and
a gate electrode of the gate electrode structure, the gate electrode is coupled to the high kappa dielectric layer, wherein the high kappa dielectric layer and the gate electrode are a replacement structure formed in a replacement gate process.

14. The computing device of claim 13, wherein the source region comprises a raised source coupled to the active region and the drain region comprises a raised drain coupled to the active region, and an interlayer dielectric material is coupled to the raised source, the raised drain, the shallow trench isolation structures, and the spacers.

15. The computing device of claim 11, wherein the semiconductor substrate is comprised of silicon, the sub-fin region includes a gallium arsenide semiconductor, and the active region includes a indium gallium arsenide semiconductor.

16. The computing device of claim 11, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

17. The computing device of claim 11, wherein the computing device is a desktop computer, a server, or a super computer and includes one or more of a display, a processor, a cooling system, a chipset, a memory, a slot, a computer bus interface, a local area network controller, a port, or interface devices coupled with the circuit board.

* * * * *